United States Patent [19]

Fyot

[11] 4,131,860

[45] Dec. 26, 1978

[54] POWER AMPLIFIER ARRANGEMENT AUTOMATICALLY MATCHED TO SERVICE CONDITIONS

[75] Inventor: Jean-Jacques Fyot, Paris, France

[73] Assignee: Thomson-CSF, Paris, France

[21] Appl. No.: 864,720

[22] Filed: Dec. 27, 1977

[30] Foreign Application Priority Data

Dec. 31, 1976 [FR] France ............................... 76 39716

[51] Int. Cl.² ........................................... H03G 3/30
[52] U.S. Cl. .................................. 330/279; 330/284; 330/298
[58] Field of Search ............ 330/133, 134, 145, 207 P, 330/279, 284, 298; 325/150, 151, 405, 413

[56] References Cited

U.S. PATENT DOCUMENTS

| | | | |
|---|---|---|---|
| 3,449,680 | 6/1969 | Schilb et al. | 330/298 |
| 4,057,765 | 11/1977 | Schuermann | 330/284 X |

*Primary Examiner*—James B. Mullins
*Attorney, Agent, or Firm*—Cushman, Darby & Cushman

[57] ABSTRACT

A power amplifier arrangement comprising a first control circuit for keeping the power dissipated by its transistors below or equal, for any excitation level, to a limit fixed in dependence upon the required reliability level and a second control circuit for completely exploring the zone of available linear characteristics of the transistors in dependence upon the load conditions, the ambient temperature and parameters specific to the transistors.

4 Claims, 3 Drawing Figures

POWER AMPLIFIER ARRANGEMENT AUTOMATICALLY MATCHED TO SERVICE CONDITIONS

This invention relates to power amplifier arrangements of which the performance data are optimised in dependence upon various service stresses, such as impedance mismatching, overexcitation, variations in ambient temperature, etc.

More particularly, the invention relates to arrangements comprising transistorised amplifier stages intended for the class AB amplification of high frequency amplitude-modulated signals, of which the performance data include a stringent linearity specification.

It is known that amplifiers must be considerably over-sized in order to obtain the minimal performance data required under the most adverse service conditions envisaged for which the amplifier is then optimised.

This solution is expensive, the possibilities afforded by the equipments being considerably under-utilised for most of the time where the service conditions enable better performance data to be obtained.

Now, it is generally accepted that the nominal performance data are degraded for a certain percentage of the time and it is in any case desirable to use the equipments to the full in order to acquire an additional transmission margin.

To this end, it is also known to optimise the performance data of an amplifier under the nominal service conditions and to provide a monitoring system which, when the service conditions develop adversely, systematically degrades these performance data, particularly by reducing the adjustable d.c. power supply voltage and/or by reducing the input level of the amplifier by means of a variable attenuator. Unfortunately, this solution requires a rapid and complex safety system and also lacks flexibility because it is difficult to provide more than one degradation level for the performance data without complicating the safety systems to an extent which would seriously affect the reliability of the arrangement as a whole and would increase its cost to the point of losing the benefit derived from the smaller dimensions of the devices by comparison with the preceding solution.

The object of the present invention is to obviate these various disadvantages and to enable optimal performance data of the amplifier in dependence upon the service conditions to be obtained at any instant.

According to the invention, there is provided a linear power amplifier arrangement having a signal input and a signal output, and comprising : a power amplifier stage having an input, and an output connected to said signal output; a power supply for delivering a d.c. voltage V for feeding said amplifier stage, having an electrical control input of said value V; an attenuator having an electrical control input of its attenuation value and connecting said amplifier arrangement input to said amplifier stage input; a first control circuit for keeping said voltage V at a value substantially similar by deficiency to a reference voltage $V_o$ corresponding to a power dissipated by said amplifier stage, irrespective of said value of attenuation, below a limit fixed in dependence upon predetermined reliability conditions; and a second control circuit for adjusting said attenuation value in order to ensure (i) to said output signal, a maximal peak voltage compatible with predetermined minimal linearity conditions of said amplifier arrangement (ii) to the average current I supplied by said power supply, a level below a predetermined value.

The invention will be better understood from a consideration of the following ensuing description and related drawings in which.

Figure 1:
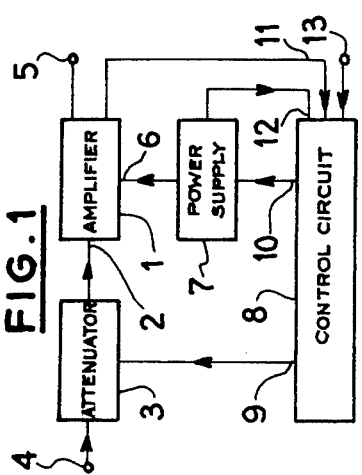
FIG. 1 is a circuit diagram of a power amplifier arrangement with optimised performance data according to the invention.

In FIG. 1, a linear power amplifier state 1 receives at an input 2, through an electrically variable attenuator 3, signals to be amplified, which are applied to the input 4 of the arrangement, and delivers the amplified signals to an output terminal 5. It is supplied with energy at an input 6 by an electrically variable power supply voltage 7. At its outputs 9 and 10, a control circuit 8 delivers the electrical control voltages which are respectively intended for the attenuator 3 and for the power supply 7 and which are derived from a signal characteristic of the ambient temperature applied to the input 13 of the circuit 8 and from electrical signals characteristic of the operating conditions effectively imparted to the amplifier stage which are delivered to two other inputs 11 and 12 of the circuit 8 and which come respectively from the amplifier 1 and the power supply 7.

Assuming for example that the amplifier 1 is formed by a classical symmetrical arrangement of two transistors operating in linear class AB, the power dissipated by each transistor, P, which is equal to the difference between the power applied and transmitted, may be expressed in the following form during a cycle of the amplified alternating signal :

(1) $P = V I_C F_1 - I_C^2 F_2$ where V is the d.c. feed voltage, $I_C$ is the peak value of the intensity of the incident signal circulating in the collector circuit, $F_1$ and $F_2$ are two parameters dependent upon the load conditions of the amplifier and the frequency of the amplified signal :

the function (1) passes through a maximum for $I_C = V F_1 / 2 F_2$ and thus assumes for (2) a maximal value $P_M = V^2 F_1^2 / 4 F_2$, equal to the transmitted power, $I_C$ being proportional to the input level of the amplifier in linear operation; from this it follows that $P_M$ is the maximal power which the transistor in question will dissipate, irrespective of this input level, for an optimal voltage $V_o$ expressed by the following relations:

$V_0 = 2/F_1 \sqrt{P_M F_2}$

The choice of $P_M$ determines the reliability of the transistor. An optimal value of the feed voltage, $V_o$, defined above is deduced therefrom, for which a dissipation P will be maintained at most equal to $P_M$ for any value of the excitation level and, in particular, for a level reaching the limit of the required linearity conditions.

Operation is thus optimised for each value assumed by the functions $F_1$ and $F_2$. However, these functions have to be clarified in order to obtain a concrete embodiment.

The following FIG. gives one example of this.

Figure 2:
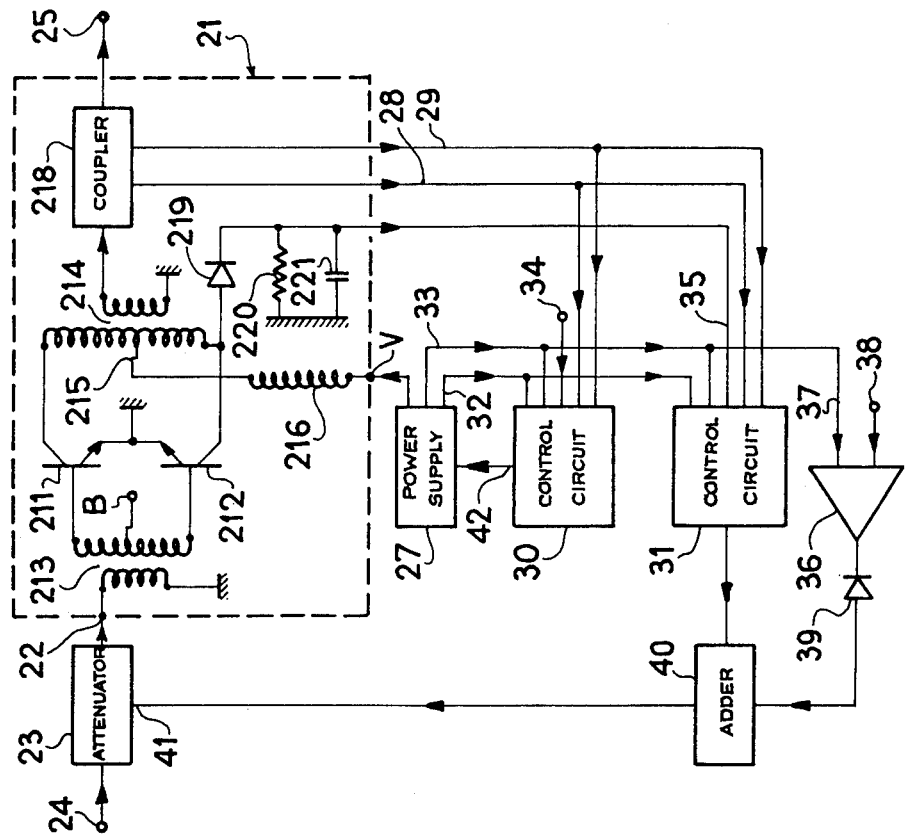
FIG. 2 shows a preferred embodiment of the arrangement illustrated in FIG. 1.

In FIG. 2, a linear power amplifier stage 21 having an output terminal 25 receives at its input 22, through an attenuator 23 identical with the attenuator 3 in FIG. 1, signals to be amplified which are applied to the input 24 of the arrangement.

FIG. 2 shows only the important elements of the amplifier 21, namely two transistors 211 and 212 of which the bases are symmetrically fed by the input signals through a transformer 213 of which the centre point of the secondary winding is connected to a biasing source B. Their emitters are grounded and their collectors are respectively connected to the ends of a symmetrical primary winding of a transformer 214 of which the center point 215 receives a biasing voltage V from a power supply 27 through a blocking inductance 216. The amplified signals, which are delivered to the terminals of the asymmetrical secondary winding of the transformer 214, feed the output terminal 25 through a directional coupler 218 which, at its outputs 28 and 29, supplies electrical voltages of which the amplitude is respectively dependent upon the power of the incident and reflected signals circulating in the load circuit of the amplifier (not shown). The outputs 28 and 29 are connected in parallel to the respective inputs of two control circuits 30 and 31. Each of these circuits comprises a calculating unit and receive in parallel two signals indicative of the voltage and the current which are respectively delivered to additional outputs 32 and 33 of the power supply 27. In addition, the circuit 30 receives at its input 34 an electrical signal characteristic of the ambient temperature coming from a sensor (not shown), whilst the circuit 31 receives at its input 35, through a detecting diode 219, a signal characteristic of the peak voltage of the alternating signal present at the collector of the transistor 212, this signal being obtained from the detecting diode 219, and from a resistor 220 and a capacitor 221 shunted between the input 35 and earth. At its two inputs 37 and 38, a differential amplifier 36 respectively receives the signal coming from the output 33 of the power supply 27 and a reference signal. Through a diode 39, it delivers a resultant signal which is applied to one of the inputs of an adder 40 which, at its other input, receives the output signal of the circuit 31. The output of the adder 40 feeds the control input 41 of the attenuator 23 whilst the output 42 of the circuit 30 feeds the control input of the power supply 27.

In the absence of excitation, the voltage B biassing the base of the transistors 211 and 212 of the amplifier 21 provides for a rest current which is a very small fraction (distinctly less than 1%) of the average maximum current.

Accordingly, the equation (1) above is still valid and, for the two transistors together, may be expressed as :

(3) $2P = VI - (S_i - S_r)$ where I is the average direct current consumed by the two transistors, $S_i$ and $S_r$ are respectively the incident and reflected powers of the amplified signal, and P and V have the same meaning as before.

From this equation (3), it may be deduced that $V = 1/I [2P + (S_i - S_r)]$.

Accordingly, when $P = P_M$, $V = V_o$ and $2P_M = S_i - S_r$, then $2P_M + (S_i - S_r) = 2\sqrt{2P_M(S_i - S_r)}$.

On the other hand, by replacing $P_M$ by its normal expression :

$P_M = T - \theta/R$ where
T is the maximum junction temperature which the transistor is capable of withstanding,
$\theta$ is the ambient temperature,
R is the global thermal junction/environment resistance of the transistor in °C/watt,
the following result is obtained :

(4) $V_o = 2\sqrt{2}/I \sqrt{(S_i - S_r)} \, \overline{T - \theta/R}$.

T and R are constant parameters for a given type of transistor and their values are directly recorded in the calculation unit of the circuit 30 which, from access points 28, 29, 33, 34 and 32, receives analog signals respectively characteristic of the quantities $S_i, S_r$, I, $\theta$ and V, so as to bring this voltage to the optimum value $V_o$ defined by the equation (4) by the action of a control signal delivered to the output terminal 42.

Thus, V is kept permanently equal to it optimum value $V_o$ for any change in the four variable quantities mentioned above which means that, in the worst case, the transistors are used in the vicinity of their maximal dissipation corresponding to the required reliability.

In addition, control of the excitation level in dependence upon its maximal value compatible with an acceptable linearity of the amplifier is obtained as follows :

The minimal linearity level may be defined by a pattern drawn in the network $I = f(V)$ of the transistor inside which is to be enscribed the semi-ellipse followed by the operating point of the transistor during a half cycle of the amplified alternating signal to remain in a linear zone of the characteristics of the transistor.

Figure 3:
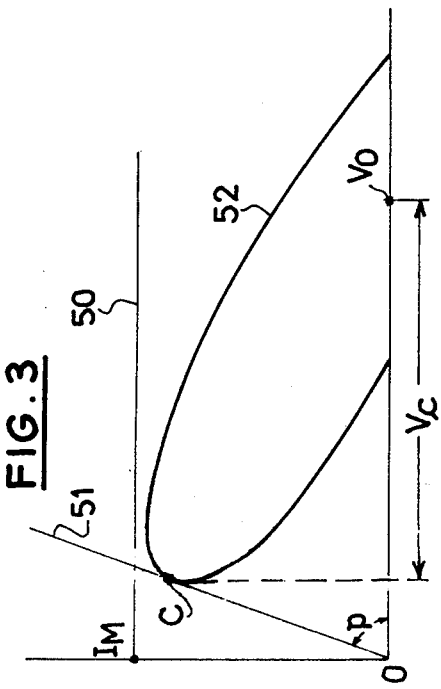
FIG. 3 is an explanatory diagram.

In FIG. 3, the collector voltage is recorded on the abscissa and the collector intensity on the ordinate. The pattern referred to above will be defined by a straight horizontal line 50, $I_M = C^{te}$, $I_M$ being the maximal permitted peak intensity before saturation, irrespective of the value of the collector voltage, and by a straight saturation line 51 of gradient p which applies an additional limitation to the maximal permitted peak intensity before saturation for the low collector voltage values. This pattern is characteristic of the type of transistor used. The curve 52 represents the path followed by the operating point of the transistor for an optimal collector voltage $V_0$ and an excitation level determined by the adjustment of the attenuator 23 so that the curve 52 is a tangent to the straignt line 51 at a point C. An alternating peak voltage $V_C$ corresponds to this excitation level, being the maximal permitted value for remaining linear with the load impedance value correspondng to this curve 52.

The corresponding adjustment of the attenuator is automatically obtained by means of the calculating unit of the circuit 31 which, at each instant, receives signals characteristic of the d.c. collector voltage V (terminal 32), the peak a.c. collector voltage $V_C$ (terminal 35) the incident power $S_i$ (terminal 28) and reflected power $S_r$ (terminal 29) and the mean d.c. intensity I (terminal 33), the value of the gradient p, which is a constant parameter characteristic of the type of the transistor used, being directly recorded in the calculating unit. The control circuit 31 delivers a control voltage which compels the variable quantities mentioned above to assume values which satisfy the requirement of tangency at the point C which is mathematically expressed by the equation:

$$V_C^2 + 4/p (S_i - S_r) + \pi^2 I^2/4 p^2 = V_o^2$$

In addition, the approach of the point of tangency is limited in such a way that the instantaneous intensity remains below $I_M$. This limitation is materialised by the differential amplifier 36 which, at one of its inputs 37, receives the mean d.c. intensity I and, at its input 38, the reference quantity $2I_M/\pi$, an expression of the mean current which would be produced by an instantaneous current linearly reaching the peak value $I_M$. The diode 39 allows through only the characteristic output signal $I > 2I_M/\pi$ which control the attenuator 23 through the adder 40. The gain of the amplifier 36 will be higher, the closer it is desired to keep the maximum value of the peak current to the fixed limit.

In the general case of the load conditions, the curve 52 will be made into a tangent to one or other of the straight lines 50 and 51.

It can be seen that the arrangement according to the invention enables the maximal available power compatible with the required levels of reliability and linearity to be obtained from an amplifier at any instant in dependence upon various service conditions.

For the purposes of the foregoing description, it has been assumed that the calculation units of the circuits 30 and 31 are formed by analog operators, although it would also be possible to use microprocessors. In this case, the input data would be digitized by sampling at high speed.

What we claim is:

1. A linear power amplifier arrangement having a signal input and a signal output, and comprising: a power amplifier stage having an input, and an output connected to said signal output; a power supply for delivering a d.c. voltage V for feeding said amplifier stage, having an electrical control input of said value V; an attenuator having an electrical control input for control of its attenuation value and connecting said amplifier arrangement input to said amplifier stage input; a first control circuit for keeping said voltage V permanently equal to an optimal value $V_o$ corresponding to a power dissipated by said amplifier stage, irrespective of said value of attenuation, below a limit fixed in dependence upon predetermined reliability conditions; and a second control circuit for adjusting said attenuation value in order to ensure (i) to said output signal, a maximal peak voltage compatible with predetermined minimal linearity conditions of said amplifier arrangement (ii) to the average current I supplied by said power supply, a level below a predetermined value.

2. An amplifier arrangement as claimed in claim 1 intended for the amplification of amplitude modulated high frequency signals, wherein said amplifier stage is a class AB symmetrical amplification stage comprising an even number of identical transistors and wherein said amplifier arrangement further comprises sensors providing; three signals respectively characteristic of the power of the high frequency incident and reflected signals $S_i$, $S_r$, delivered by said amplifier stage and of said average current I, a fourth signal characteristic of the ambient temperature $\theta$ and a fifth signal characteristic of said voltage V; said first circuit having five inputs for recving respectively said five signals and an output connected to said power supply control input and comprising first calculating means for working out said optimal value $V_o$ from first four signals of said signals, and from two fixed parameters respectively characteristic of the global thermal resistance R and the maximal permitted junction temperature T of said transistors.

3. An amplifier arrangement as claimed in claim 2 wherein said amplifier arrangement further comprises an additional sensor providing a sixth signal characteristic of the peak voltage $V_C$ of the high frequency signal developed at the collector of each of said transistors; said second circuit having five inputs for receiving said first, second, third and sixth signals, and an output connected to said attenuator control input, and comprising second calculating means for working out the maximal value of said peak voltage $V_C$ corresponding to $V = V_o$, from said first second third and sixth signals and from the value of a fixed parameter characteristic of the gradient p of the saturation line of said transistors for low collector voltage values.

4. An amplifier arrangement as claimed in claim 3, wherein said first calculating means perform the operations $$2\sqrt{2/I}\sqrt{(S_i - S_r)} \, T - \theta/R$$

of which the result is said optimal value $V_o$ which said first circuit has to make said power supply deliver and wherein said second calculating means perform the operations $$V_C^2 + 4/p (S_i - S_r) + \pi^2 I^2/4p^2$$

of which the result has to be equal to $V_o^2$ by adjusting said attenuation value.

* * * * *